United States Patent
Khandelwal et al.

(10) Patent No.: US 8,860,468 B1
(45) Date of Patent: Oct. 14, 2014

(54) CLOCK MULTIPLEXER

(71) Applicants: Amitesh Khandelwal, Indirapuram (IN); Gaurav Jain, Khara (IN); Abhishek Mahajan, Chandigarh (IN)

(72) Inventors: Amitesh Khandelwal, Indirapuram (IN); Gaurav Jain, Khara (IN); Abhishek Mahajan, Chandigarh (IN)

(73) Assignee: Freescale Semiconductor, Inc., Austin, TX (US)

( * ) Notice: Subject to any disclaimer, the term of this patent is extended or adjusted under 35 U.S.C. 154(b) by 28 days.

(21) Appl. No.: 13/912,170

(22) Filed: Jun. 6, 2013

(51) Int. Cl.
*H03K 17/00* (2006.01)
*H03K 17/16* (2006.01)

(52) U.S. Cl.
CPC .................................. *H03K 17/16* (2013.01)
USPC ............................................ 327/99; 327/298

(58) Field of Classification Search
None
See application file for complete search history.

(56) References Cited

U.S. PATENT DOCUMENTS

| | | | |
|---|---|---|---|
| 5,231,636 A | 7/1993 | Rasmussen | |
| 6,501,304 B1 | 12/2002 | Boerstler | |
| 6,563,349 B2 * | 5/2003 | Mavila et al. | 327/99 |
| 6,975,145 B1 | 12/2005 | Vadi | |
| 7,046,047 B2 * | 5/2006 | Daijo | 327/99 |
| 7,629,828 B1 | 12/2009 | Nekl | |
| 7,679,408 B2 | 3/2010 | Hailu | |
| 8,086,989 B2 | 12/2011 | Hailu | |
| 2008/0284484 A1 * | 11/2008 | Lou | 327/298 |
| 2008/0309393 A1 * | 12/2008 | Sun et al. | 327/298 |
| 2009/0016049 A1 | 1/2009 | Hedrick | |
| 2009/0016495 A1 | 1/2009 | Malas et al. | |
| 2009/0039940 A1 * | 2/2009 | Hong et al. | 327/298 |
| 2010/0001767 A1 * | 1/2010 | Shikata | 327/99 |

OTHER PUBLICATIONS

Mahmud, Rafey, "Techniques to make clock switching glitch free," EE Times Jun. 26, 2003 (http://www.eetimes.com/story/OEG20030626S0035).

* cited by examiner

*Primary Examiner* — Tuan T Lam
(74) *Attorney, Agent, or Firm* — Charles Bergere

(57) ABSTRACT

A clock multiplexer includes first and second input stages for outputting first and second clock signals, respectively. The first and second input stages each include a flip-flop, a latch and a first logic gate. Reset terminals of the flip-flops receive a select signal based on which the first and second input stages output the first and second clock signals. A second logic gate is connected to the first and second input stages for selectively providing the first and second clock signals as an output clock signal.

12 Claims, 5 Drawing Sheets

CLOCK MULTIPLEXER

BACKGROUND OF THE INVENTION

The present invention relates generally to digital circuits, and more specifically, to a clock multiplexer circuit.

Integrated circuits are widely used in computer systems for performing various functions and include many electronic circuit modules that work in tandem. Examples of such electronic circuit modules include processors, logic gates, flip-flops, latches, system buses, and so forth. These circuits are often referred to as functional circuits. The functional circuits are driven by a clock. Depending on the system requirements, different functional circuits may require different clock signals (having different frequencies) for their operation; e.g., an integrated circuit may include one set of functional circuits that operates in a first clock domain and another set of functional circuits that operates in a second clock domain. Such integrated circuits are referred to as asynchronous integrated circuits.

A clock multiplexer is used to provide clock signals with different frequencies. FIG. 1A is a schematic block diagram of a clock multiplexer 100. The clock multiplexer 100 has two input terminals for receiving first and second input clock signals CLOK0 and CLK1, a select terminal for receiving a select signal SELECT and an output terminal for providing either of the first and second clock signals CLK0 and CLK1 as an output clock signal OUT CLOCK. FIG. 1B is a timing diagram of the CLK0, CLK1, SELECT and OUT CLOCK signals. The clock multiplexer 100 provides the first clock signal CLK0 as the output clock signal OUT CLOCK signal when the select signal SELECT is low and provides the second clock signal CLK1 as the output clock signal OUT CLOCK when the select signal SELECT is high. As shown in FIG. 1B, the select signal SELECT transitions from low to high when the first clock signal CLK0 is high and the second clock signal CLK1 is low, which introduces a glitch in the OUT CLOCK signal due to the first clock signal CLK0 being high and being provided at the output until the select signal SELECT goes high. Glitches in clock signals are undesirable as they lead to erroneous operation of the electronic circuit modules.

TO eliminate glitches, clock multiplexers are often designed using a combination of flip-flops and logic gates. One such conventional clock multiplexer 200 is illustrated in FIG. 2A. The clock multiplexer 200 includes four flip-flops (first through fourth) 202a-202d, four AND gates (first through fourth) 204a-204d, a NOT gate 206 and an OR gate 208. The first and second flip-flops 202a, 202b are connected in series and clocked with a first clock signal CLK0. Similarly, the third and fourth flip-flops 202c, 202d are connected in series and clocked with a second clock signal CLK1. The output of the second flip-flop 202b and the first clock signal CLK0 are input to the second AND gate 204b, and the output of the fourth flip-flop 202d and the second clock signal CLK1 are input to the fourth AND gate 204d. The outputs of the second and fourth AND gates 204b, 204d are input to the OR gate 208 and the output of the OR gate 208 is the clock out signal.

The input to the first flip-flop 202a is an output of the first AND gate 204a, and the inputs to the first AND gate 204a are an inverted select signal SELECT (output by the NOT gate 206) and the inverted output of the fourth flip-flop 204d. Similarly, the input to the third flip-flop 202c is an output of the third AND gate 204c, and the inputs to the third AND gate 204c are the select signal SELECT and the inverted output of the second flip-flop 202b.

Referring now to FIG. 2B, which is a timing diagram of the signals of the multiplexer 200, the operation of the clock multiplexer 200 will be explained. Assuming the select signal SELECT to be low and the output the second flip-flop 202b to be high, the high output of the second flip-flop 202b causes the output of the to reflect the state of the first clock signal CLK0. The OR gate 208 thus receives and outputs the first clock signal CLK0 as the output clock signal OUT CLOCK (as long as the other input to the OR gate 208 is low). The inverting output terminal of the second flip-flop 202b is low, which (along with the low select signal SELECT) causes the third AND gate 204c to output a low signal (CLK1 SEL), which causes the third flip-flop 202c to output a low signal (CLK1 EN) at a positive edge of the second clock signal CLK1, which in turn causes the fourth flip-flop 202d to output a low signal at a subsequent negative edge of the second clock signal CLK1. Since the output of the fourth flip-flop 202d is low, the output of the fourth AND gate 204d is low. The inverting output terminal of the fourth flip-flop 202d is high, so a high signal is input to the first AND gate 204a. The first AND gate 204a also receives the inverted SELECT signal, which also is high, and so the first AND gate outputs a high signal (CLK0 SEL).

When the select signal SELECT goes from low to high, the first AND gate 204a receives a low select signal SELECT by way of the NOT gate 206, which causes the output of the first AND gate 204a to go low (CLK0 SEL), which causes the output of the first flip-flop 202a to go low (CLK0 EN) at a positive edge of the first clock signal CLK0, which in turn causes the output of the second flip-flop 202b to go low signal at a subsequent negative edge of the first clock signal CLK0. The low output of the second flip-flop 202b disables the second AND gate 204b, which gates the CLK0 signal. The inverted output of the second flip-flop 202b is high, and is input to the third AND gate 204c. The third AND gate 204c also receives the SELECT signal, which is high, and so the output of the third AND gate 204c goes high (CLK1 SEL), which the output of the third flip-flop 202c to go high (CLK1 EN) at a positive edge of the second clock signal CLK1, which in turn causes the output of the fourth flip-flop 202d to go high at a subsequent negative edge of the second clock signal CLK1, which enables the fourth AND gate 204d to output the second clock signal CLK1 (CLK1 OUT). The OR gate 208 thus receives and provides the second clock signal CLK1 as the output clock signal OUT CLOCK.

As can be seen in FIG. 2B, the OR gate 208 outputs two extra clock cycles of the first clock signal CLK0 when the select signal SELECT transitions from low to high. Further when the first clock signal CLK0 is gated during switching, the CLK1 EN signal goes high at the next positive edge of the second clock signal CLK1 (second clock cycle of CLK1 as seen in FIG. 2). The CLK1 OUT signal is generated at the end of the second clock cycle of the second clock signal CLK1. In other words, when the select signal SELECT transitions from low to high, two additional clock cycles of the first clock signal CLK0 are output and two clock cycles of the second clock signal CLK1 are wasted before the second clock signal CLK1 is output. This negatively impacts the performance of the electronic circuit modules. Moreover, if either of the first and second clock signals CLK0 and CLK1 stops during transition, the conventional clock multiplexer 200 will stop operating.

Therefore, it would be advantageous to have a clock multiplexer that efficiently switches between the input clock signals, and that overcomes the above-mentioned limitations of conventional clock multiplexers.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1B:
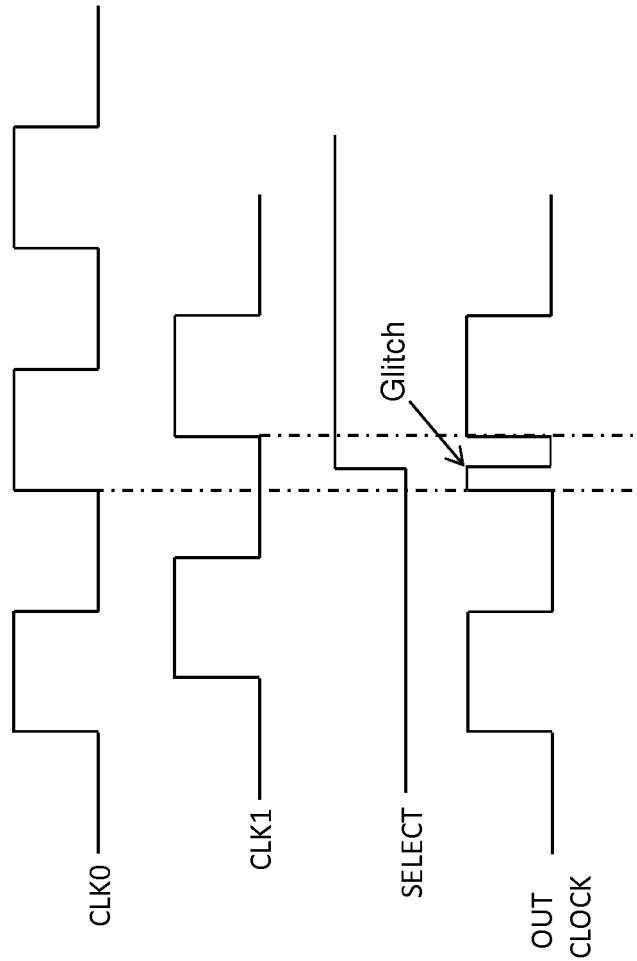
FIG. 1B is a timing diagram of various signals of the clock multiplexer of FIG. 1A.
Figure 1A:
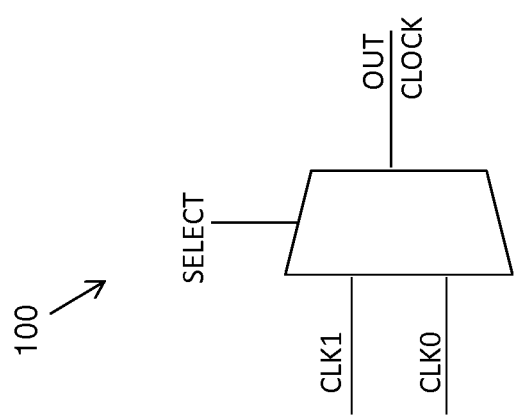
FIG. 1A is a schematic block diagram of a first conventional clock multiplexer.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for transmitting at least one of first and second clock signals is provided. The system includes a first input stage for outputting the first clock signal based on a first output signal. The first input stage includes a first flip-flop, a first latch and a first logic gate. The first flip-flop has an input terminal for receiving an inverted second output signal, a clock terminal for receiving the first clock signal and a reset terminal for receiving a select signal. The first flip-flop generates a first enable signal. The first latch has an input terminal connected to an output terminal of the first flip-flop for receiving the first enable signal and a clock terminal for receiving the first clock signal. The first latch generates the first output signal at an output terminal and an inverted first output signal at an inverting output terminal thereof. The first logic gate has a first input terminal for receiving the first clock signal and a second input terminal connected to the output terminal of the first latch for receiving the first output signal. The first logic gate outputs the first clock signal based on the first output signal. The system further includes a second input stage for outputting the second clock signal based on a second output signal. The second input stage includes a second flip-flop, a second latch, and a second logic gate. The second flip-flop has an input terminal connected to the inverting output terminal of the first latch for receiving the inverted first output signal, a clock terminal for receiving the second clock signal, and a reset terminal for receiving an inverted select signal. The second flip-flop generates a second enable signal at an output terminal thereof. The second latch has an input terminal connected to the output terminal of the second flip-flop for receiving the second enable signal, a clock terminal for receiving the second clock signal, and an inverting output terminal connected to the input terminal of the first flip-flop. The second latch generates the second output signal at an output terminal and the inverted second output signal at the inverting output terminal thereof. The second logic gate has a first input terminal for receiving the second clock signal and a second input terminal connected to the output terminal of the second latch for receiving the second output signal. The second logic gate outputs the second clock signal based on the second output signal. A third logic gate is connected to the first and second logic gates for outputting at least one of the first and second clock signals.

In another embodiment of the present invention, the system for outputting at least one of the first and second clock signals is used in a multiplexer.

Various embodiments of the present invention provide a clock multiplexer for selectively outputting first and second clock signals. The clock multiplexer includes a first input stage for outputting the first clock signal and a second input stage for outputting the second clock signal, based on a select signal. Each input stage includes a combination of a flip-flop and a latch. An OR gate is connected to the first and second input stages for selectively providing the first and second clock signals as an output clock signal. When a select signal transitions from low to high, the OR gate outputs a half clock cycle (positive cycle) of the first clock signal (as opposed to two complete clock cycles output by the conventional clock multiplexer 200). When the first clock signal is gated, the second input stage outputs the second clock signal at the negative transition of the second clock cycle of the second clock signal CLK1 that appears after switching. In other words, when the select signal transitions from low to high, only one half clock cycle of the first clock signal is transmitted and one half clock cycle of the second clock signal CLK1 is wasted before the clock multiplexer switches to the second clock signal, which considerably improves the switching performance and efficiency of the clock multiplexer. The clock multiplexer of the present invention also has just two AND gates, as opposed to four AND gates needed by the conventional clock multiplexer 200, which reduces the circuit area.

Figure 3A:
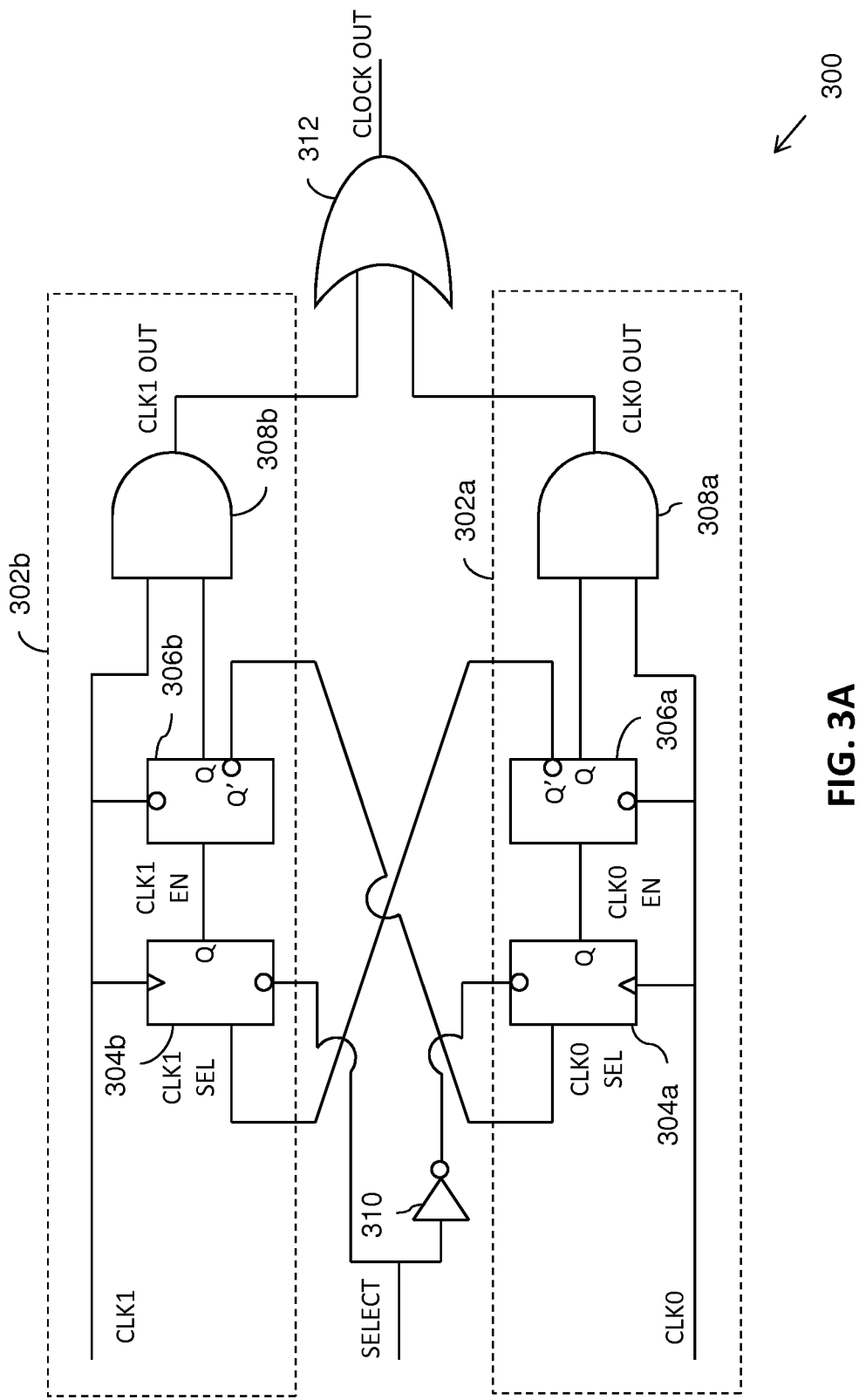
FIG. 3A is a schematic block diagram of a clock multiplexer in accordance with an embodiment of the present invention.

Referring now to FIG. 3A, a schematic block diagram of a clock multiplexer 300 in accordance with an embodiment of the present invention is shown. The clock multiplexer 300 includes first and second input stages 302a and 302b. The first input stage includes a first flip-flop 304a, a first latch 306a and a first AND gate 308a. The second input stage includes a second flip-flop 304b, a second latch 306b and a second AND gate 308b. As used herein, flip-flop refers to an edge sensitive element and latch refers to a level sensitive element.

The first flip-flop 304a receives a SELECT signal at its reset input terminal by way of a NOT gate 310, and a first clock signal CLK0 at its clock input terminal. An output terminal of the first flip-flop 304a is connected to an input terminal of the first latch 306a. A clock input terminal of the first latch 306a receives the first clock signal CLK0. An output terminal of the first latch 306a is connected to an input terminal of the first AND gate 308a. The first clock signal CLK0 is provided to another input terminal of the first AND gate 308a. An output terminal of the first AND gate 308a, which is the output of the first input state 302a, is connected to an input terminal of an OR gate 312.

The second input stage 302b is similar to the first input stage 302a. More specifically, the second flip-flop 304b receives the SELECT signal at its reset input terminal and the second clock signal at its clock input terminal. An output terminal of the second flip-flop 304b is connected to an input terminal of the second latch 306b. A clock terminal of the second latch 306b receives the second clock signal CLK1. An output terminal of the second latch 306b is connected to an input terminal of the second AND gate 308b. The second clock signal CLK1 is provided to another input terminal of the second AND gate 308b. An output terminal of the second AND gate 308b is connected to an input terminal of the OR gate 312. An inverting output terminal of the second latch 306b is connected to an input terminal of the first flip-flop 304a, and an inverting output terminal of the first latch 306a is connected to a first input terminal of the second flip-flop 304b.

In various embodiments of the present invention, the first and second flip-flops 304a and 304b are D type flip-flops and the first and second latches 306a and 306b are D type latches. The first and second flip-flops 304a and 304b are positive edge-triggered; and the first and second latches 306a and 306b are negative latches. Also, the first and second clock signals CLK0 and CLK1 are asynchronous.

The operation of the clock multiplexer 300 will now be explained with reference to the timing diagrams shown in FIG. 3B. When the SELECT signal is low (i.e., logic low state), the reset terminal of the second flip-flop 304b receives the low SELECT signal, which resets the second flip-flop 304b. Thus the output of the second flip-flop 304b is low (CLK1 EN) at a positive edge of the second clock signal CLK1, which causes the second latch 306b to output a low signal when the second clock signal CLK1 goes low, which disables the second AND gate 308b, thereby gating the second clock signal CLK1.

Meanwhile, the inverting output terminal of the second latch 306b outputs a high signal (CLK0 SEL), which is received at the input terminal of the first flip-flop 304a. As the SELECT signal input to the reset terminal of the first flip-flop 304a by way of the NOT gate 310 is high, the output of the second flip-flop 304a goes high at a positive edge of the first clock signal CLK0, which causes the first latch 306a to output a high signal when the first clock signal CLK0 subsequently goes high. Since the output of the first latch 306a is high and it is input to the first AND gate, the first AND gate 308a is enabled, and therefore outputs the first clock signal CLK0 (CLK0 OUT). The OR gate 312 then receives and outputs the first clock signal CLK0 as the output clock signal OUT CLOCK.

When the SELECT signal transitions from low to high, the reset terminal of the first flip-flop 304a receives the logic low SELECT signal by way of the NOT gate 310 and is reset. The first flip-flop outputs a low signal at a positive edge of the first clock signal CLK0, which in turn causes the first latch 306a to output a low signal when the first clock signal CLK0 subsequently goes high, which disables the first AND gate 308a, thereby gating the first clock signal CLK0.

Meanwhile, the inverting output terminal of the first latch 306a outputs a high signal (CLK1 SEL), which is received at the input terminal of the second flip-flop 304b. The reset terminal of the second flip-flop 304b receives the logic high SELECT signal and the second flip-flop 304b outputs a logic high signal (CLK1 EN) at a positive edge of the second clock signal CLK1, which in turn causes the second latch 306b to generate a logic high signal when the second clock signal CLK1 subsequently goes low. The output of the second latch 206b being high enables the second AND gate 308b such that the second AND gate 308b outputs the second clock signal CLK1 (CLK1 OUT). The OR gate 312 thus receives and outputs the second clock signal CLK1 as the output clock signal OUT CLOCK.

Figure 2A:
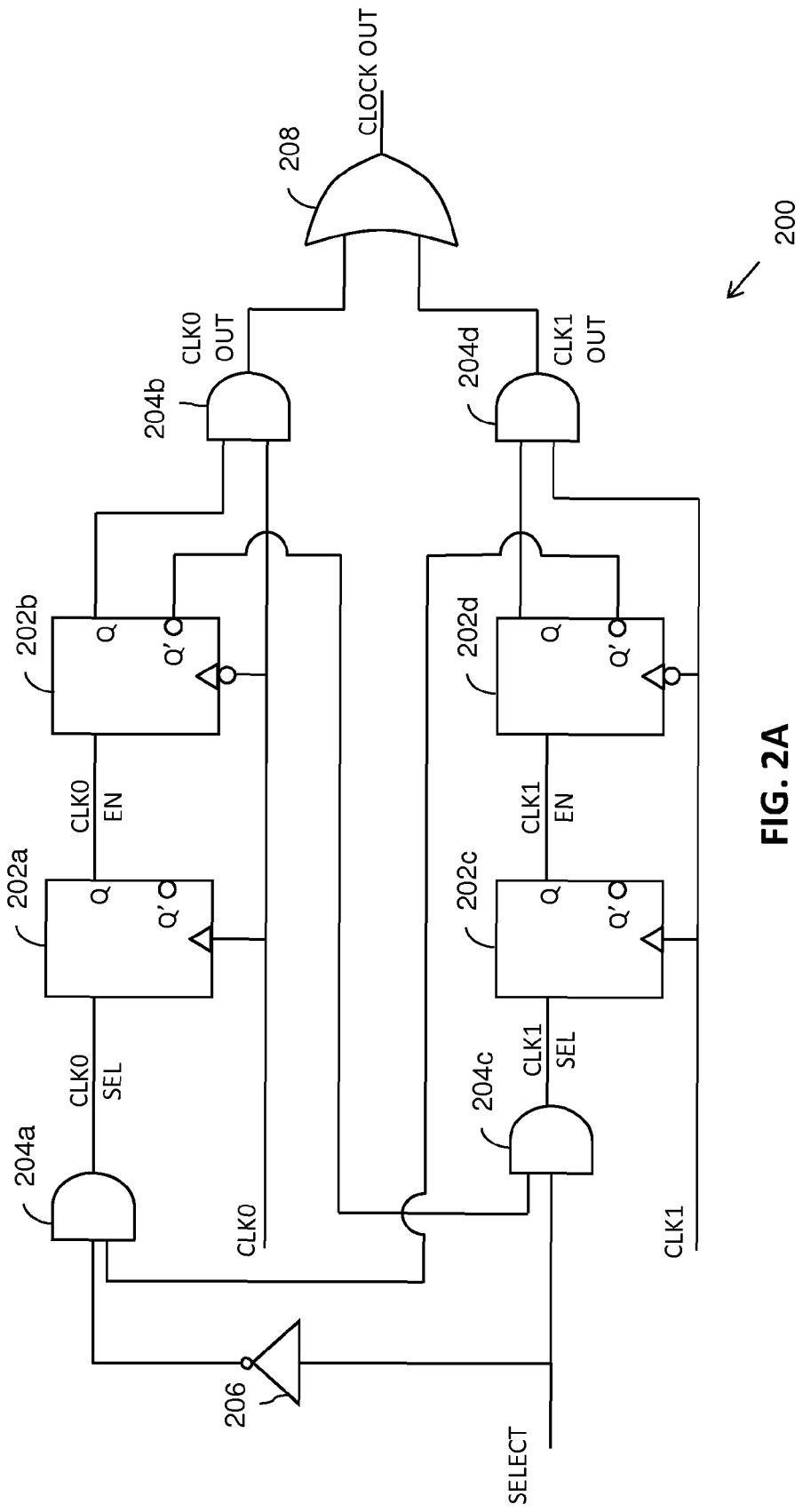
FIG. 2A is a schematic block diagram of another conventional clock multiplexer.
Figure 2B:
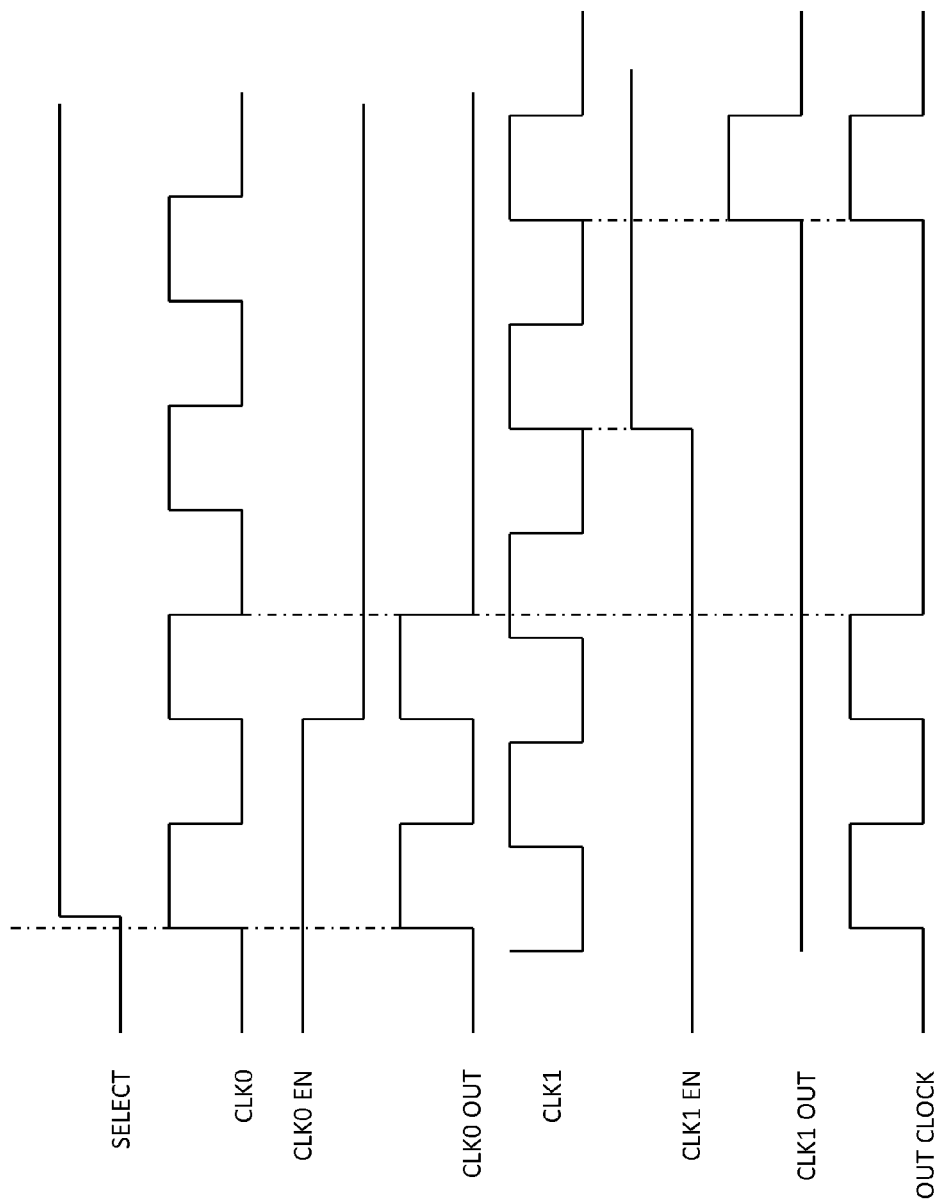
FIG. 2B is a timing diagrams of various signals of the conventional clock multiplexer of FIG. 2A.
Figure 3B:
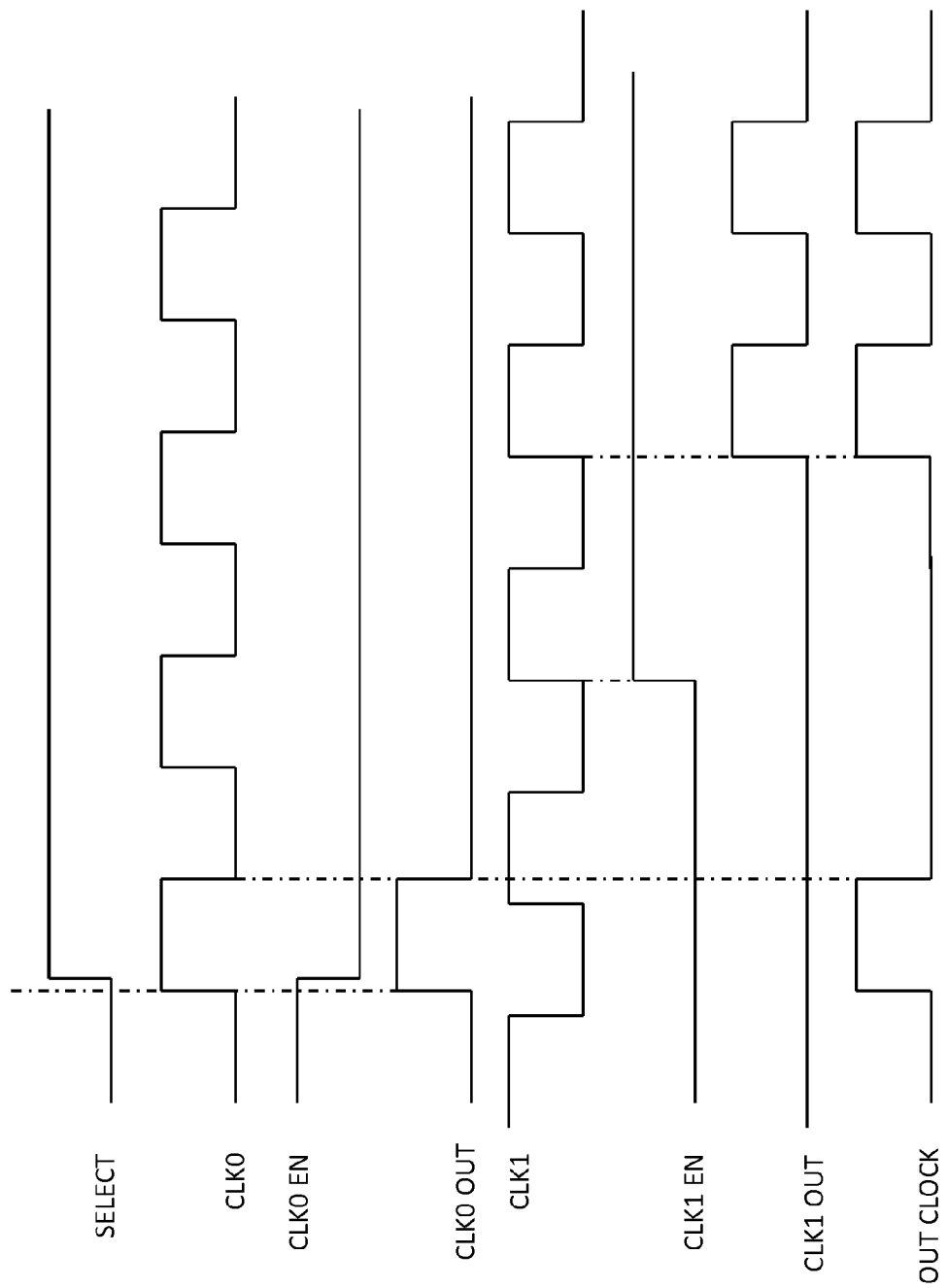
FIG. 3B is a timing diagram of various signals of the clock multiplexer of FIG. 3A in accordance with an embodiment of the present invention.

As can be seen in FIG. 3B, the OR gate 312 outputs only a half clock cycle (positive cycle) of the first clock signal CLK0, as opposed to the convention multiplexer 200 that outputs two complete clock cycles when the SELECT signal transitions from low to high. When the first clock signal CLK0 is gated, the CLK1 EN signal goes high at the positive edge of the next clock cycle of the second clock signal CLK1 (second clock cycle of CLK1 as seen in FIG. 2) and the CLK1 OUT signal is generated at the negative transition of the second clock cycle of the second clock signal CLK1. In other words, when the SELECT signal transitions from low to high, only one half clock cycle of the first clock signal CLK0 is output and one half clock cycle of the second clock signal CLK1 is wasted before the clock multiplexer 300 switches to the second clock signal CLK1, which improves considerably the switching performance and efficiency of the clock multiplexer 300. Moreover, the clock multiplexer 300 only uses two AND gates as opposed to four AND gates required by the conventional clock multiplexer 200, so the circuit area is less of the circuit 300 is less than that of the circuit 200.

Further, the clock multiplexer 300 will continue to operate smoothly in the event that either of the first and second clock signals CLK0 and CLK1 dies. Assuming the OR gate 312 is outputting the first clock signal CLK0, if the first clock signal CLK0 dies, the OR gate 312 stops outputting and waits for the first clock signal CLK0 to resume. If the SELECT signal transitions from low to high when the first clock signal CLK0 dies, the first flip-flop 304a is reset. As the first clock signal CLK0 is low, the first latch 306a outputs a logic low signal, i.e., the logic high signal CLK1 SEL, which is received by the second flip-flop 304b and as described above, the OR gate 312 subsequently outputs the second clock signal CLK1 as the output clock signal OUT CLOCK. In another case, if the first clock signal CLK0 is functioning and the second clock signal CLK1 dies and the SELECT signal transitions from low to high, the OR gate stops outputting the first clock signal CLK0 and the input terminal of the second flip-flop 304b receives the logic high signal (CLK1 SEL). However, as the second clock signal CLK1 is dead, the second flip-flop 304b waits for the second clock signal CLK1 to appear, after which the second clock signal CLK1 is propagated normally without any glitch.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A clock multiplexer for providing an output clock signal, comprising:
   a first input stage for outputting a first clock signal, wherein the first input stage includes,
   a first flip-flop having an input terminal, a clock input terminal for receiving the first clock signal, and a reset input terminal for receiving a select signal, wherein the first flip-flop outputs a first enable signal at an output terminal thereof;
   a first latch having an input terminal connected to the output terminal of the first flip-flop for receiving the first enable signal, and a clock input terminal for receiving the first clock signal, wherein the first latch outputs a first output signal at an output terminal thereof and an inverted first output signal at an inverting output terminal thereof; and a first logic gate having a first input terminal that receives the first clock signal and a second input terminal connected to the output terminal of the first latch for receiving the first output signal, wherein the first logic gate outputs the first clock signal based on the first output signal;

a second input stage for outputting a second clock signal, wherein the second input state includes, a second flip-flop having an input terminal connected to the inverting output terminal of the first latch for receiving the inverted first output signal, a clock input terminal for receiving the second clock signal, and a reset input terminal for receiving an inverted select signal, wherein the second flip-flop generates a second enable signal at an output terminal thereof;

a second latch having an input terminal connected to the output terminal of the second flip-flop for receiving the second enable signal, a clock input terminal for receiving the second clock signal, an output terminal for providing a second output signal, and an inverting output terminal connected to the input terminal of the first flip-flop for providing an inverted second output signal to the input terminal of the first flip-flop; and a second logic gate having a first input terminal that receives the second clock signal and a second input terminal connected to the output terminal of the second latch for receiving the second output signal, wherein the second logic gate outputs the second clock signal based on the second output signal; and a third logic gate connected to the first and second logic gates for outputting at least one of the first and second clock signals.

2. The clock multiplexer of claim 1, wherein the first and second logic gates comprise AND gates.

3. The clock multiplexer of claim 1, wherein the third logic gate is an OR gate.

4. The clock multiplexer of claim 1, wherein the first and second flip-flops comprise D type flip-flop.

5. The clock multiplexer of claim 1, wherein the first and second latches comprise a D type latches.

6. The clock multiplexer of claim 1, wherein the first and second clock signals are asynchronous.

7. A system for outputting first and second clock signals, comprising:

a first input stage for outputting the first clock signal based on a first output signal, the first input state including, a first flip-flop having an input terminal for receiving an inverted second output signal, a clock terminal for receiving the first clock signal, and a reset terminal for receiving a select signal, wherein the first flip-flop generates a first enable signal at an output terminal thereof;

a first latch having an input terminal connected to the output terminal of the first flip-flop for receiving the first enable signal, and a clock terminal for receiving the first clock signal, wherein the first latch generates the first output signal at an output terminal thereof and an inverted first output signal at an inverting output terminal thereof; and a first logic gate having a first input terminal that receives the first clock signal and a second input terminal connected to the output terminal of the first latch for receiving the first output signal, wherein the first logic gate outputs the first clock signal based on the first output signal;

a second input stage for outputting the second clock signal based on a second output signal, the second input stage including, a second flip-flop having an input terminal connected to the inverting output terminal of the first latch for receiving the inverted first output signal, a clock terminal for receiving the second clock signal, and a reset terminal for receiving an inverted select signal, wherein the second flip-flop generates a second enable signal at an output terminal thereof;

a second latch having an input terminal connected to the output terminal of the second flip-flop for receiving the second enable signal, a clock terminal for receiving the second clock signal, and an inverting output terminal connected to the input terminal of the first flip-flop, wherein the second latch generates the second output signal at an output terminal and the inverted second output signal at the inverting output terminal thereof; and a second logic gate having a first input terminal for receiving the second clock signal and a second input terminal connected to the output terminal of the second latch for receiving the second output signal, wherein the second logic gate outputs the second clock signal based on the second output signal; and a third logic gate connected to the first and second logic gates for outputting at least one of the first and second clock signals.

8. The system of claim 7, wherein the first and second logic gates comprise AND gates.

9. The system of claim 7, wherein the third logic gate is an OR gate.

10. The system of claim 7, wherein the first and second flip-flops comprise D type flip-flops.

11. The system of claim 7, wherein the first and second latches comprise D type latches.

12. The system of claim 7, wherein the first and second clock signals are asynchronous.

* * * * *